United States Patent
Schmiege et al.

(10) Patent No.: US 10,643,838 B2
(45) Date of Patent: May 5, 2020

(54) IN-SITU FORMATION OF NON-VOLATILE LANTHANIDE THIN FILM PRECURSORS AND USE IN ALD AND CVD

(71) Applicant: Applied Materials, Inc., Santa Clara, CA (US)

(72) Inventors: Benjamin Schmiege, Santa Clara, CA (US); Jeffrey W. Anthis, San Jose, CA (US); David Thompson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 135 days.

(21) Appl. No.: 16/013,884

(22) Filed: Jun. 20, 2018

(65) Prior Publication Data

US 2018/0366322 A1 Dec. 20, 2018

Related U.S. Application Data

(60) Provisional application No. 62/522,676, filed on Jun. 20, 2017.

(51) Int. Cl.
*H01L 21/00* (2006.01)
*C23C 16/40* (2006.01)
*H01L 21/02* (2006.01)
*C23C 16/455* (2006.01)
*C23C 16/34* (2006.01)

(52) U.S. Cl.
CPC ........ *H01L 21/02194* (2013.01); *C23C 16/34* (2013.01); *C23C 16/45553* (2013.01); *H01L 21/02186* (2013.01); *H01L 21/02192* (2013.01); *H01L 21/02271* (2013.01); *H01L 21/02274* (2013.01)

(58) Field of Classification Search
CPC .............. C23C 16/34; C23C 16/45553; H01L 21/02172; H01L 21/02192; H01L 21/02194; H01L 21/02186; H01L 21/02271; H01L 21/02274
See application file for complete search history.

(56) References Cited

U.S. PATENT DOCUMENTS

| 7,799,937 | B2 * | 9/2010 | Piccariello | ........... C07C 259/06 556/110 |
| 9,099,301 | B1 | 8/2015 | Lansalot-Matras | |
| 2003/0144487 | A1 * | 7/2003 | Grushin | ................ C07F 9/5345 534/15 |
| 2005/0282898 | A1 * | 12/2005 | Buchwald | ............ C07D 209/48 514/561 |
| 2008/0087945 | A1 * | 4/2008 | Forbes | .................. C23C 16/308 257/325 |
| 2010/0240601 | A1 * | 9/2010 | Piccariello | ........... A61K 31/165 514/23 |
| 2011/0163062 | A1 * | 7/2011 | Gordon | .................... C23C 16/18 216/13 |
| 2012/0070378 | A1 * | 3/2012 | Pang | .................. A61K 49/0021 424/9.2 |
| 2013/0078454 | A1 | 3/2013 | Thompson et al. | |
| 2013/0288427 | A1 | 10/2013 | Hung et al. | |

FOREIGN PATENT DOCUMENTS

WO    WO 2008/002546 A1 *  1/2008  ........... C07C 257/14

OTHER PUBLICATIONS

Grundy, Joanna, et al., "A new class of linked-bis(N,N'-dialkylamidinate) ligand: applications in the synthesis of bimetallic aluminium complexes". Journal of Organometallic Chemistry 662 (2002) pp. 178-187.*
Trifonov, Alexander A., et al., "Synthesis of lanthanide complexes coordinated by an asymmetric cyclopentadienyl ligand". Journal of Organometallic Chemistry 527 (1997) 225-237.*
Schumann, Herbert, et al., "Organometallic Compounds of the Lanthanides. 158.1 Alkenyl-Functionalized Cyclopentadienyl Complexes of Yttrium, Samarium, and Lutetium and Their Hydroboration". Organometallics 2003, 22, 118-128.*
Schumann, Herbert, et al., "Organometallic Compounds of the Lanthanides. 42.1 Bis(dimethoxyethane) lithium Bis(cyclopentadienyl)bis(trimethylsilyl)lanthanide Complexes". Organometallics 1988, 7, 2004-2009.*
Sroor, Farid M., et al., "Synthesis and catalytic activity of homoleptic lanthanide-tris(cyclopropylethinyl)amidinates". New J. Chem., 2015, 39, 7595-7601.*
Kresinski, Roman A., "Trivalent Chemistry: Cyclopentadienyl". Encyclopedia of Inorganic and Bioinorganic Chemistry, 2012, pp. 1-6.*

* cited by examiner

*Primary Examiner* — Bret P Chen
(74) *Attorney, Agent, or Firm* — Servilla Whitney LLC

(57) ABSTRACT

Methods of forming a lanthanide-containing film comprising exposing a substrate surface to a lanthanide-containing precursor, a metal halide and a nitrogen precursor are described. The lanthanide-containing precursor has the general formula $(CpR_x)_2Ln(N,N\text{-dialkylamidinate})$ where Cp is a cyclopentadienyl or 6, 7 or 8 membered ring, R is H, C1-C4 alkyl, x=1 to number of C in Cp, alkyl is C1 to C4 alkyl. The metal halide deposits metal halide on the substrate surface and reacts with lanthanide-containing species to convert the lanthanide-containing species to a lanthanide halide. The nitrogen-containing precursor forms a lanthanide-metal-nitride film on the substrate surface.

20 Claims, No Drawings

IN-SITU FORMATION OF NON-VOLATILE LANTHANIDE THIN FILM PRECURSORS AND USE IN ALD AND CVD

CROSS-REFERENCE TO RELATED APPLICATIONS

This application claims priority to U.S. Provisional Application No. 62/522,676, filed Jun. 20, 2017, the entire disclosure of which is hereby incorporated by reference herein.

TECHNICAL FIELD

The present disclosure relates generally to methods of depositing thin films. In particular, the disclosure relates lanthanum precursors and methods of deposition lanthanum containing films.

BACKGROUND

Lanthanide and other rare earth elements such as yttrium are finding increasing application in the microelectronics industry in uses such as VT tuning and etch resistant materials. Thin film precursors of these elements (Sc, Y, La—Lu) typically have low vapor pressures. The low vapor pressure makes it more difficult to provide sufficient precursor species to the substrate.

Additionally, the ligands of typical precursors are well designed for deposition of MOx films, but can be relatively unreactive with ALD co-reagents towards non-metal oxide film types. Therefore, there is a need in the art for lanthanum precursors and improved methods for the deposition of lanthanum containing films.

SUMMARY

One or more embodiments of the disclosure are directed to methods of forming a lanthanide-containing film. A substrate surface is exposed to a lanthanide-containing precursor to form a lanthanide-containing species on the substrate surface. The lanthanide-containing precursor has the general formula $(CpRx)_2Ln(N,N\text{-dialkylamidinate})$ where Cp is a cyclopentadienyl or 6, 7 or 8 membered ring, R is H, C1-C4 alkyl, x=1 to number of C in Cp, alkyl is C1 to C4 alkyl. The substrate surface is exposed to a metal halide to deposit metal halide on the substrate surface and react with lanthanide-containing species to convert the lanthanide-containing species to a lanthanide halide. The lanthanide halide and metal halide are exposed to a nitrogen-containing precursor to form a lanthanide-metal-nitride film on the substrate surface.

Additional embodiments of the disclosure are directed to methods of forming lanthanide-containing films. A substrate surface is exposed to a lanthanide-containing precursor to form a lanthanide-containing species on the substrate surface. The lanthanide-containing precursor has the general formula $(CpR_x)_2Ln(N,N\text{-dialkylamidinate})$ where Cp is cyclopentadienyl, each R is H, C1-C4 alkyl, x=1 to the number of C in Cp, alkyl is C1 to C4 alkyl, with the proviso that at least one R is not H. The substrate surface is exposed to a titanium halide to deposit titanium halide on the substrate surface and react with the lanthanide-containing species to convert the lanthanide-containing species to a lanthanide halide. The lanthanide halide and titanium halide are exposed to a nitrogen-containing precursor to form a lanthanide-titanium-nitride film on the substrate surface.

Further embodiments of the disclosure are directed to methods of forming lanthanide-containing films. A substrate surface is exposed to a lanthanide-containing precursor to form a lanthanide-containing species on the substrate surface. The lanthanide-containing precursor has the general formula $(CpR_x)_2Ln(N,N\text{-dialkylamidinate})$ where Cp is a cyclopentadienyl ring, R is H, C1-C4 alkyl, x=1 to 5, alkyl is C1 to C4 alkyl, with the proviso that at least one R is not H, where Ln is lanthanum. The substrate surface is exposed to a metal halide consisting essentially of titanium tetrachloride to deposit titanium chloride on the substrate surface and react with lanthanide-containing species to convert the lanthanide-containing species to a lanthanide halide. The lanthanide halide and titanium chloride are exposed to a nitrogen-containing precursor to form a lanthanide-titanium-nitride film on the substrate surface, the nitrogen-containing precursor comprising one or more of $N_2$, $NH_3$, hydrazine, hydrazine derivatives, $NO_2$, plasmas thereof or combinations thereof.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods to generate a species on a substrate surface, when that species itself may not have a suitable vapor pressure to allow for traditional vapor phase delivery. Some embodiments advantageously provide adequate pairing of two metal containing precursors to allow a cooperative effect and enhance film growth rate. Some embodiments advantageously provide in-situ generation of Ln-X species, where X is F, Cl, Br or I.

Lanthanide halides have low vapor pressure. Some embodiments advantageously provide methods to form lanthanide halides in-situ. Some embodiments advantageously use the lanthanide metals higher affinity for halides than early transition metals to form lanthanide films.

In some embodiments, the method includes the use of two metal containing precursors delivered to a substrate by vapor phase delivery; at the surface, the precursors exchange ligands to generate a species that is more reactive with a subsequent co-reagent exposure to form a thin film.

One possible mechanism for a reaction of a lanthanide species with $TiCl_4$ and $NH_3$ to generate a TiLaN film is illustrated in Scheme 1.

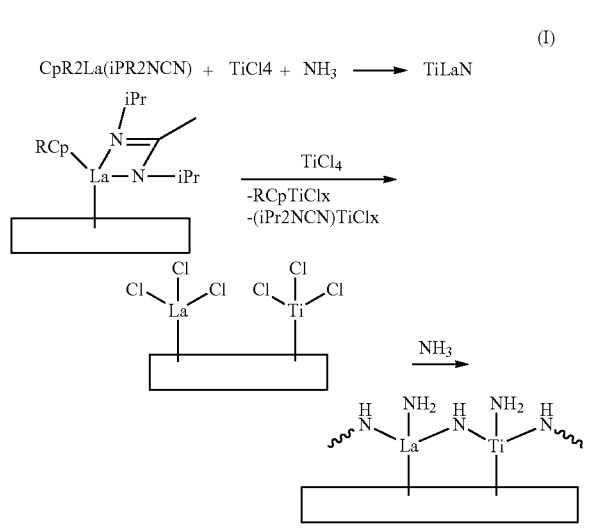

In some embodiments, the process of Scheme I forms films of the general type $M_xLn_yN_z$ can be made, where M=Ti, Zr, Hf, V, Nb, Hf, Mo, W, Ir. Ln=Sc, Y, La . . . Lu. The nitrogen containing precursor may be ammonia, hydrazine, $NHR_2$, R=C1-C6, $N_2$, $H_2$.

In some embodiments, the process includes exposure to plasma and/or a mixture of gases. A second scheme is described below that forms LnN films, but without containing a second metal, M. In this method a lanthanide precursor is delivered by vapor phase methods to a surface. A fluorinating reagent such as HF or HF-pyridine is used to generate a M-F terminated surface, eliminating a protonated form of the ligand. Finally reaction with a nitrogen containing precursor such as ammonia generates Ln-N bonds and an —$NH_2$ or —NH terminated surface with elimination of $NH_4F$. This scheme should be quite general for lanthanide precursors owing to the driving force to form a strong Ln-F bond.

In some embodiments, the fluorinating reagent consists essentially of HF or HF-pyridine. Without being bound by theory, it is believed that pyridine acts as a stabilizing agent for HF. In some embodiments, the method comprises exposing the substrate surface to a lanthanide precursor to form a lanthanide-species on the substrate surface. The lanthanide species can then be exposed to HF-pyridine or other fluorinating agent to form a lanthanide fluoride film. In some embodiments, the lanthanide precursor comprising or consisting essentially of $Cp_2La(amd)$, where Cp is a cyclopentadienyl ring and amd is an amidinate ligand to form a lanthanide species on the substrate surface. The lanthanide species on the substrate can then be exposed to HF or HF-pyridine to form a lanthanide fluoride film. In some embodiments, the lanthanide fluoride film formed consists essentially of lanthanum and fluorine atoms. As used in this manner, the term "consists essentially of lanthanum and fluorine atoms" means that the sum of the lanthanum and fluorine composition of the film is greater than or equal to about 95%, 98%, 99% or 99.5% on an atomic basis. In some embodiments, the method stops with formation of the lanthanide fluoride film.

Scheme 2 illustrates a possible mechanism with $La(THD)_3$, HF and $NH_3$ to generate LaN thin films.

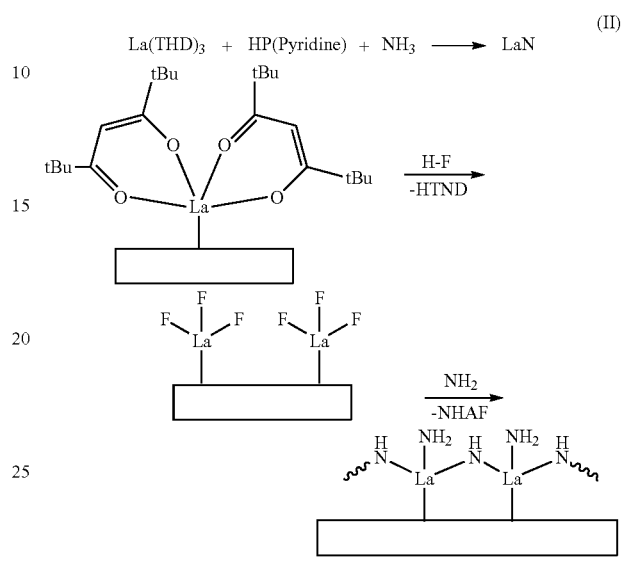

Accordingly, one or more embodiments of the disclosure are directed to methods of forming a lanthanide-containing film. A substrate surface is exposed to a lanthanide-containing precursor to form a lanthanide-containing species on the substrate surface. The lanthanide-containing precursor has the general formula $(CpR_x)_2Ln(N,N\text{-dialkylamidinate})$, where Cp is a cyclopentadienyl ring or $(ChxR_x)_2Ln(N,N\text{-dialkylamidinate})$, where Chx is a cyclohexadienyl ring, or $(ChpR_x)_2Ln(N,N\text{-dialkylamidinate})$, where Chp is a cycloheptadienyl ring or $(CocR_x)_2Ln(N,N\text{-dialkylamidinate})$, where Coc is a cyclooctadienyl ring, R is H, C1-C4 alkyl, x=1 to number of C in Cp, alkyl is C1 to C4 alkyl. Stated differently, in some embodiments, the lanthanide-containing precursor has the general formula $(CdalkR_x)_2La(N,N\text{-dialkylamidinate})$, where Cdalk is a cyclodialkenyl ring. Cyclodialkenyl rings of some embodiments comprise one or more of cyclopentadienyl, cyclohexadienyl, cycloheptadienyl or cyclooctadienyl rings.

In some embodiments, at least one of the R groups is a C1-C4 alkyl groups. In some embodiments, at least one of the R groups is not H. In some embodiments, Cp is a cyclopentadienyl group having at least one R group comprising an alkyl group having 2 to 4 carbon atoms.

The metal can be any suitable metal including any of the lanthanides, yttrium or scandium. In some embodiments, the metal is selected from the group consisting of La, Ce, Pr, Nd, Pm, Sm, Eu, Gd, Tb, Dy, Ho, Er, Tm, Yb, Lu, Y, Sc and combinations thereof. Examples and embodiments may be discussed with regard to the lanthanum atom; however, those skilled in the art will understand that this is merely exemplary and should not be taken as limiting the scope of the disclosure.

The substrate surface is exposed to a metal halide to deposit a metal halide on the substrate surface and react with the lanthanide-containing species to convert the lanthanide-containing species to a lanthanide halide. In some embodiments, the metal halide comprises one or more of titanium (Ti), zirconium (Zr), tantalum (Ta), hafnium (Hf), vanadium (V), niobium (Nb), molybdenum (Mo), tungsten (W) or iridium (Ir). In one or more embodiments, the metal halide comprises $TiCl_xBr_yI_z$, where the sum of x, y and z is 4. In some embodiments, the metal halide comprises a metal atom selected from the group consisting of Ti, Zr, Ta, Hf, V, Nb, Mo, W, Ir or combinations thereof. As will be understood by the skilled artisan, the number of halogen atoms associated with the metal halide will depend on the metal atom. In some embodiments, the metal halide comprises substantially no fluorine atoms. As used in this regard, the term "substantially no fluorine atoms" means that the metal halide comprises less than or equal to about 5%, 2% or 1% fluorine atoms on an atomic basis. In some embodiments, the metal halide consists essentially of $TiCl_4$. As used in this regard, the term "consists essentially of" means that the metal halide is greater than or equal to about 95%, 98% or 99% of the stated species on a molar basis.

The lanthanide halide and metal halide are exposed to a nitrogen-containing precursor to form a lanthanide-metal-nitride film on the substrate surface. In some embodiments, the nitrogen-containing precursor comprises one or more of $N_2$, $NH_3$, hydrazine, hydrazine derivatives, $NO_2$, plasmas thereof or combinations thereof.

The molar equivalents of the metal halide relative to the lanthanide-containing precursor can vary to change the composition of the lanthanide and metal species. In some embodiments, the metal halide concentration is two equivalents of the lanthanide-containing precursor composition. In some embodiments, there are in the range of about 0.5 to about 5 molar equivalents of the metal halide to the lanthanide.

The temperature of the method is maintained at a temperature to prevent breakdown of the precursors and allow sufficient reaction driving force. In some embodiments, the method occurs at a temperature in the range of about 200 to about 300 C.

A ternary film TiLaN was deposited using $TiCl_4$, a lanthanum containing precursor and $NH_3$ introduced to a substrate sequentially, with each precursor exposure separated by inert gas purge. The order of precursor addition had an effect on the resulting film composition and growth rate. The La:Ti ratio ranged from ~1:1-2:1 and showed a 60% change in GPC for experiments where only the order of $TiCl_4$ and lanthanide exposure was different. Films were readily oxidized upon exposure to air.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of forming a lanthanide-containing film, the method comprising:
    exposing a substrate surface to a lanthanide-containing precursor to form a lanthanide-containing species on the substrate surface, the lanthanide-containing precursor having the general formula $(CpR_x)_2Ln(N,N-dialkylamidinate)$ where Cp is a cyclopentadienyl or 6, 7 or 8 membered ring, R is H, C1-C4 alkyl, x=1 to number of C in Cp, alkyl is C1 to C4 alkyl;
    exposing the substrate surface to a metal halide to deposit metal halide on the substrate surface and react with lanthanide-containing species to convert the lanthanide-containing species to a lanthanide halide; and
    exposing the lanthanide halide and metal halide to a nitrogen-containing precursor to form a lanthanide-metal-nitride film on the substrate surface.

2. The method of claim 1, wherein at least one of the R groups is a C1-C4 alkyl groups.

3. The method of claim 1, wherein Cp is a cyclopentadienyl group having at least one R group comprising an alkyl group having 2 to 4 carbon atoms.

4. The method of claim 1, wherein the lanthanide is selected from the group consisting of La, Ce, Pr, Nd, Pm, Sm, Eu, Gd, Tb, Dy, Ho, Er, Tm, Yb, Lu, Y, Sc and combinations thereof.

5. The method of claim 4, wherein the metal atom comprises La.

6. The method of claim 1, wherein the metal halide comprises titanium.

7. The method of claim 6, wherein the metal halide comprises $TiCl_xB_yI_z$, where the sum of x, y and z is 4.

8. The method of claim 7, wherein the metal halide consists essentially of $TiCl_4$.

9. The method of claim 1, wherein the nitrogen-containing precursor comprises one or more of $N_2$, $NH_3$, hydrazine, hydrazine derivatives, $NO_2$, plasmas thereof or combinations thereof.

10. The method of claim 1, wherein the method occurs at a temperature in the range of about 200 to about 300 C.

11. A method of forming a lanthanide-containing film, the method comprising:
    exposing a substrate surface to a lanthanide-containing precursor to form a lanthanide-containing species on the substrate surface, the lanthanide-containing precursor having the general formula $(CpR_x)_2Ln(N,N-dialkylamidinate)$ where Cp is cyclopentadienyl, ring or $(ChxR_x)_2Ln(N,N-dialkylamidinate)$, where Chx is a cyclohexadienyl ring, or $(ChpR_x)_2Ln(N,N-dialkylamidinate)$, where Chp is a cycloheptadienyl ring or $(CocR_x)_2Ln(N,N-dialkylamidinate)$, where Coc is a cyclooctadienyl each R is H, C1-C4 alkyl, x=1 to number of C in the cyclodialkenyl ring, alkyl is C1 to C4 alkyl, with the proviso that at least one R is not H;
    exposing the substrate surface to a titanium halide to deposit titanium halide on the substrate surface and react with the lanthanide-containing species to convert the lanthanide-containing species to a lanthanide halide; and
    exposing the lanthanide halide and titanium halide to a nitrogen-containing precursor to form a lanthanide-titanium-nitride film on the substrate surface.

12. The method of claim 11, wherein Cp is a cyclopentadienyl group having at least one R group comprising an alkyl group having 2 to 4 carbon atoms.

13. The method of claim 11, wherein the lanthanide is selected from the group consisting of La, Ce, Pr, Nd, Pm, Sm, Eu, Gd, Tb, Dy, Ho, Er, Tm, Yb, Lu, Y, Sc and combinations thereof.

14. The method of claim 13, wherein the metal atom comprises La.

15. The method of claim 11, wherein the titanium halide comprises $TiCl_xB_yI_z$, where the sum of x, y and z is 4.

16. The method of claim 11, wherein the nitrogen-containing precursor comprises one or more of $N_2$, $NH_3$, hydrazine, hydrazine derivatives, $NO_2$, plasmas thereof or combinations thereof.

17. A method of forming a lanthanide-containing film, the method comprising:

exposing a substrate surface to a lanthanide-containing precursor to form a lanthanide-containing species on the substrate surface, the lanthanide-containing precursor having the general formula $(CpR_x)_2Ln(N,N-dialkylamidinate)$ where Cp is a cyclopentadienyl ring, R is H, C1-C4 alkyl, x=1 to 5, alkyl is C1 to C4 alkyl;

exposing the lanthanide containing species on the substrate surface to HF or HF-pyridine to form a lanthanide-fluoride film on the substrate surface.

18. The method of claim 17, wherein the lanthanide is selected from the group consisting of La, Ce, Pr, Nd, Pm, Sm, Eu, Gd, Tb, Dy, Ho, Er, Tm, Yb, Lu, Y, Sc and combinations thereof.

19. The method of claim 18, wherein the metal atom comprises La.

20. The method of claim 17, wherein the method occurs at a temperature in the range of about 200 to about 300 C.

\* \* \* \* \*